United States Patent [19]

Volkmann et al.

[11] Patent Number: 4,968,383
[45] Date of Patent: Nov. 6, 1990

[54] METHOD FOR MOLDING OVER A PREFORM

[75] Inventors: Curtis L. Volkmann; John J. Kester; Gregory A. Stevens, all of Midland, Mich.

[73] Assignee: The Dow Chemical Company, Midland, Mich.

[21] Appl. No.: 363,557

[22] Filed: Jun. 8, 1989

Related U.S. Application Data

[63] Continuation of Ser. No. 109,664, Oct. 16, 1987, Pat. No. 4,861,407, which is a continuation-in-part of Ser. No. 876,029, Jun. 18, 1986, abandoned, which is a continuation-in-part of Ser. No. 746,170, Jun. 18, 1985, abandoned.

[51] Int. Cl.$^5$ .......................................... H01L 21/306
[52] U.S. Cl. ......................... 156/643; 156/272.8; 156/654; 156/664; 156/665; 156/666; 219/121.65; 219/121.66; 264/25; 264/265
[58] Field of Search .............. 156/643, 272.82, 272.2, 156/272.6, 275.1, 275.3, 275.7, 273.3, 308.2, 308.4, 309.6, 309.9, 390, 644, 153, 634, 155, 535, 242, 245, 629, 633, 654, 655, 656, 664, 665, 666; 427/53.1, 54.1, 55; 219/121.6, 121.63, 121.64, 121.65, 121.66, 121.68, 121.69, 121.85, 121.73, 121.74, 121.75; 264/22, 25, 248, 259, 265, 271.1, 219

[56] References Cited

U.S. PATENT DOCUMENTS

| | | | |
|---|---|---|---|
| 3,193,424 | 7/1965 | Scott | 156/153 |
| 4,004,050 | 1/1977 | Rabito | 156/331.7 |
| 4,341,823 | 7/1982 | Sexton | 427/305 |
| 4,525,250 | 6/1985 | Fahrmbacher-Lutz | 427/309 |
| 4,615,763 | 10/1986 | Gelorme | 156/643 |
| 4,746,390 | 5/1988 | Badalec | 156/272.8 |

FOREIGN PATENT DOCUMENTS 0085392 2/1984 Japan.

Primary Examiner—Merrell C. Cashion
Attorney, Agent, or Firm—Timothy S. Stevens; Wendy B. Buskop; Burke M. Halldorson

[57] ABSTRACT

A method for adhesively bonding a first body to a second body, the first body comprising a metallic substrate, such as a piece of steel, or comprising a metallic substrate and a filler therein, such as ceramic fiber reinforced aluminum, the second body comprising any type of substrate, such as a piece of glass, plastic or metal. The first body is pretreated by placing it in the path of an energy beam, such as a laser beam, to form projections on the metallic substrate by evaporation and/or melting of the metallic substrate of the first body, substantially all of the projections being less than 20 micrometers in height, or to expose filler by evaporation of the metallic substrate of the first body. The second body can be untreated, pretreated as above or pretreated another way, such as by solvent washing or sandblasting. An adhesive is then coated on the pretreated area of the first body and the first body adhered to the second body. The cured adhesive interlocks with the projections and/or the exposed filler to produce a stronger bond. Similarly, an object, such as a rubber gasket, can be molded to a so-pretreated body so that the cured molding compound interlocks with the projections and/or the exposed filler to produce a stronger bond between the molded object and the so-pretreated body. The invention is also an article made by the method.

14 Claims, 11 Drawing Sheets

METHOD FOR MOLDING OVER A PREFORM

CROSS-REFERENCE TO RELATED APPLICATION

This is a continuation of application Ser. No. 109,664, filed Oct. 16, 1987, now U.S. Pat. No. 4,861,407, which is a continuation-in-part of application Ser. No. 876,029, filed June 18, 1986, now abandoned, which is a continuation-in-part of application Ser. No. 746,170, filed June 18, 1985, now abandoned.

This application is a continuation-in-part of the copending application Serial No. 746,170, filed June 18, 1985, now abandoned herein fully incorporated by reference, and the copending application Serial No. 876,029 filed June 18, 1986, now abandoned herein fully incorporated by reference.

BACKGROUND OF THE INVENTION

The present invention relates to a method for adhesively bonding two bodies together, at least one of which is metallic, and articles produced by this method.

A need has long existed for a method of enhancing the adhesive bonding characteristics of various materials by pretreatment of the surfaces of materials to be bonded. This need has extended to enhancing the bonding characteristics of materials which are essentially clean surfaces, e.g., solvent cleaned surfaces, as well as enhancing the bonding characteristics of contaminated surfaces, e.g., surfaces covered with a protective coating such as a wax or oil coated surface.

These needs have developed for example out of the automotive and aircraft industries' dissatisfaction with current pretreatment techniques and bonding results.

One means of treating metals for specific benefits such as surface hardening, surface smoothing, welding and hole drilling is the use of an energy beam such as a laser beam. An elegant explanation of metal treatment using energy beams comprising laser beams is contained in U.S. Pat. No. 4,122,240 granted to Banas et al. FIG. 1 therein shows a plot of absorbed power density versus interaction time. At relatively low absorbed power density applied for relatively long times, materials can be heated to appreciable depths without melting the surface and thus can be subjected to "transformation hardening." At very high absorbed power density applied for extremely short periods of time to a surface coated with a thin layer of preferably black paint (which enhances absorption of the laser beam) surface vaporization of the paint is so violent that a shock wave of sufficient amplitude moves through the material that can result in "shock hardening" (see U.S. Pat. No. 4,401,477 to Clauer et al.). At mid-absorbed power density applied for intermediate time periods, the irradiated material can be vaporized to a significant depth for "hole drilling" applications. At lower power density applied for longer time periods, the material can be melted to significant depths for "deep penetration welding." Using approximately the same absorbed power density as in "deep penetration welding," but for shorter periods of time, Banas et al. achieved "skin melting." In skin melting a thin layer of the material irradiated is melted but not vaporized and then rapidly self-cooled.

Langen et al. in U.S. Pat. No. 4,368,080 apply 0.5 to 16 joules/cm$^2$ per pulse and a pulse time of from 1 to 100 microseconds to clean rust from metallic objects prior to painting. The power density used by Langen et al. is relatively low to prevent melting or vaporization of the parent metal, but high enough to vaporize the rust or to convert the rust to a form not detrimental to subsequent paint performance.

In Japanese Patent Application No. 54-26509 to Iuchi et al., a laser is used to remove oil from steel plates prior to painting. The oil is compounded with light absorbing chemicals to improve the efficiency of conversion of the light energy into heating the oil film and only the oil is vaporized, not the underlying steel.

In Japanese Patent No. 81,116,867 zinc galvanized steel sheets are polished to remove the zinc coating, irradiated with a laser beam to remove residual zinc, phosphate treated and then painted.

Japanese Patent Application No. 59-85392 to Nippon Avionics, describes a method for binding a metallic substrate to a metallic material or a non-metallic material. The method comprises irradiating a laser beam on the surface of the metallic substrate in air or a selected gas, thereby melting the irradiated portion of the substrate and forming projections on the surface of the substrate, coating an adhesive on the so-treated surface and adhering it to a metallic or non-metallic material. This reference teaches that generally it is desirable to make projections more than 20 micrometers in height, 50 micrometer projections being easily made, to produce a better bond than produced using conventional pretreatments such a sandblasting.

Prior techniques for enhancing the bonding characteristics of metallic bodies, exclusive of energy beam treatment, include sandblasting, shot peening, brushing, pickling with acid, anodizing and washing with solvents, see for example, "Adhesives Technology Handbook," A. H. Landrock, 1985, Noyes Publications, ISBN 0-8155-1040-3. All of these techniques have undesirable features such as waste disposal of spent chemicals. 5Nevertheless, surface treatment usually results in enhanced bondability. For example, galvanized steel sheets formed into automotive door panels are generally coated with a lubricant prior to forming to extend forming die life and to preserve the surface finish of the panel. However, before the panel can be fastened to other parts with an adhesive, the lubricant usually needs to be removed from the panel, e.g., by washing with a solvent, for yet improved bondability. Often, even better bondability can be obtained by additionally roughening or etching the panel surface to be bonded by sandblasting and/or chemical treatment, such as a phosphate treatment. The present invention is an improved method of the laser treatment type.

SUMMARY OF THE INVENTION

The invention in one aspect is a method for adhesively bonding a first body to a second body, the first body having a metallic substrate such as an aluminum casting. The method comprises the steps of pretreating an area of the first body, contacting the pretreated area of the first body with an adhesive agent or contacting an area of the second body with an adhesive agent or contacting the pretreated area of the first body and an area of the second body with an adhesive agent, the area of the second body being pretreated or non-pretreated, and then joining the first body with the second body so that the adhesive agent is interposed between the pretreated area of the first body and the area of the second body. The improvement of this aspect of the invention comprises as the step of pretreating an area of the first body, the step of placing the first body in the path of an energy beam having a selected energy density for a duration effective to form projections on the metallic substrate of the first body, the projections formed by evaporation and/or melting of the metallic substrate of the first body, substantially all of the projections being less than 20 micrometers in height. The invention in another aspect is also an article made by the method of this paragraph.

The invention in another aspect is a method for adhesively bonding a first body to a second body, the first body comprising a metallic substrate and a filler therein such as ceramic fiber reinforced aluminum. The method comprises the steps of pretreating an area of the first body, contacting the pretreated area of the first body with an adhesive agent or contacting an area of the second body with an adhesive agent or contacting the pretreated area of the first body and an area of the second body with an adhesive agent, the area of the second body being pretreated or non-pretreated, and then joining the first body with the second body so that the adhesive agent is interposed between the pretreated area of the first body and the area of the second body. The improvement of this aspect of the invention comprises as the step of pretreating an area of the first body, the step of placing the first body in the path of an energy beam having a selected energy density for a duration effective to expose the filler of the first body by evaporation of the metallic substrate of the first body. The invention in another aspect is also an article made by the method of this paragraph.

The invention in another aspect is a method for molding an object, such as a rubber gasket, to a body having a metallic substrate, such as cold rolled steel. The method comprises the steps of pretreating an area of the metallic substrate of the body, contacting the body with a mold, the mold having a chamber at least partially defining the shape of the object to be molded to the body, at least a portion of the pretreated area of the metallic substrate of the body exposed to the chamber, filling the mold with uncured molding compound so that the uncured molding compound contacts the walls of the mold and at least a portion of the pretreated area of the metallic substrate of the body, curing the molding compound in the chamber so that an object is molded to the body. The improvement of this aspect of the invention comprises placing the body in the path of an energy beam having a selected energy density for a duration effective to form projections on the metallic substrate of the body, the projections formed by evaporation and/or melting of the metallic substrate of the body, substantially all of the projections being less than 20 micrometers in height. The invention in another aspect is an article made by the method of this paragraph.

The invention in another aspect is a method for molding an object, such as an epocy resin flange, to a body having a metallic substrate and a filler therein such as ceramic fiber reinforced aluminum. The method comprises the steps of pretreating an area of the metallic substrate of the body, contacting the body with a mold, the mold having a chamber at least partially defining the shape of the object to be molded to the body, at least a portion of the pretreated area of the metallic substrate of the body exposed to the chamber, filling the mold with uncured molding compound, such as uncured two part epoxy resin, so that the uncured molding compound contacts the walls of the mold and at least a portion of the pretreated area of the metallic substrate of the body, curing the molding compound in the chamber so that an object is molded to the body. The improvement of this aspect of the invention comprises placing the body in the path of an energy beam having a selected energy density for a duration effective to expose a portion of the filler of the body by evaporation of the metallic substrate of the body. The invention in another aspect is an article made by the method of this paragraph.

DETAILED DESCRIPTION OF THE INVENTION

Figure 1:
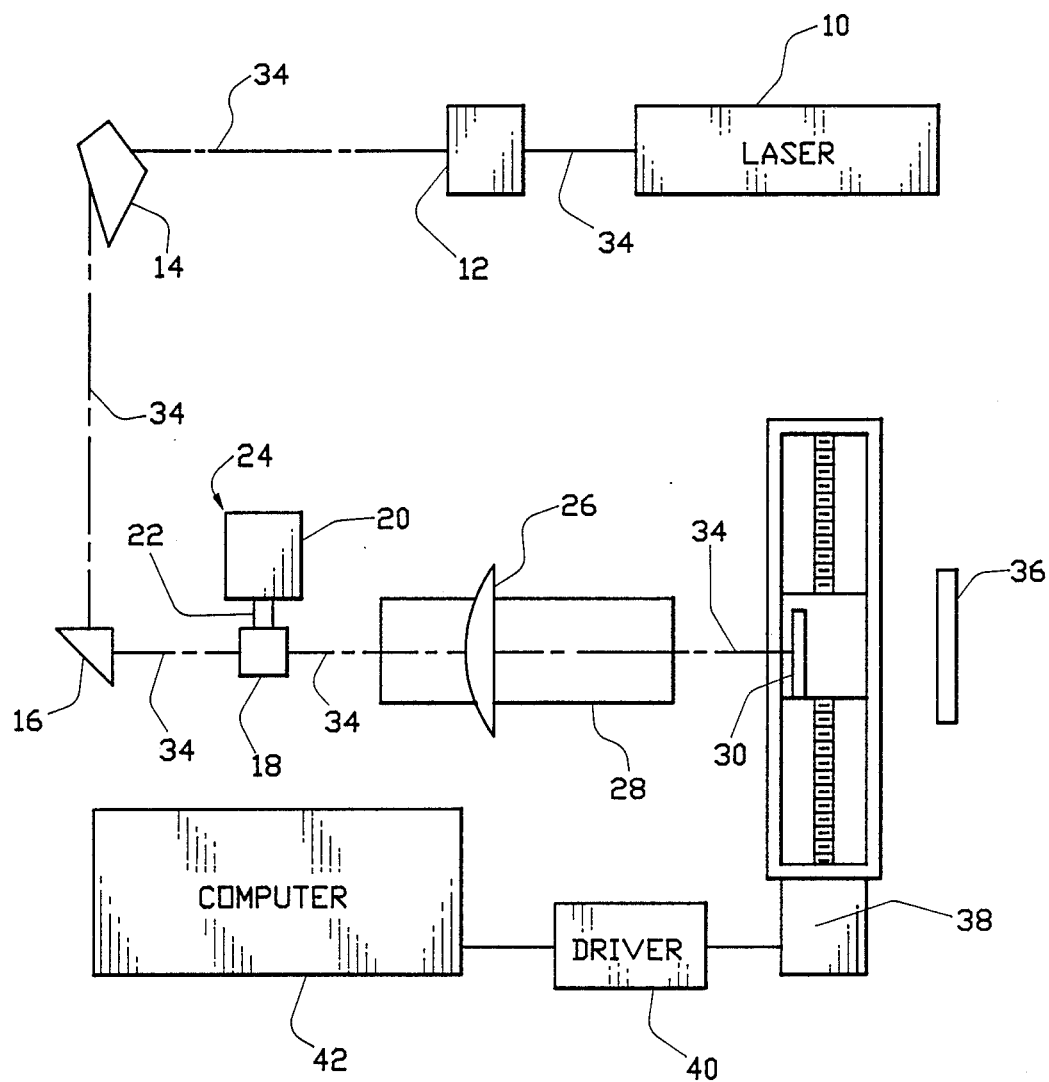
FIG. 1 shows an apparatus useful for the method of the invention.

An apparatus useful for modifying surfaces to be bonded according to the method of the invention is typically illustrated in FIG. 1 and involves a laser 10 and means 14, 16 and 26 for guiding the beam from the laser to the surface of the object to be treated. A preferred laser 10 is a Q-switched Nd:YAG laser, but other lasers which are preferred include gas lasers, $CO_2$ lasers, and excimer lasers. The Kirk-Othmer "Encyclopedia of Chemical Technology," Third Edition, Volume 154, pages 42-81, John Wiley & Sons, New York (1979), describes various types of lasers and their uses. The apparatus of the invention may also comprise one or more lasers or a laser with beam splitting means adapted for the purposes of the invention.

The beam 34 issuing from laser 10 can be altered by a harmonic generator 12 capable of reducing the wavelength of the beam proportional to a selected integral factor, and optical components, such as a prism 14 to spacially separate differing frequencies of the laser beam, a right-angle prism 16, and a preferred cylindrical focusing lens 26 which focuses the laser beam onto a surface to be treated 30 and results in a generally elliptical shaped area of surface treatment at any one time. The length of said ellipse is determined by the diameter of the laser beam and can be made longer by placing a diverging lens, not shown, in the laser beam 34 as is well-known in the art. The dotted line 34 between laser 10 and lens 26 can further represent an optical fiber for directing the beam 34 at the surface to be treated.

A power meter 24 can be disposed between the right-angle prism 16 and the focusing lens 26. The power meter essentially has two parts, a detector head 18 integrally connected by means 22 with a conventional analog readout meter 20. The detector head 18 can be placed in the path of the laser beam to detect the average power of the laser beam.

The cylindrical focusing lens 26 is disposed on a translation stage 28. The translation stage 28 includes a track for moving the lens 26 parallel to the path of the beam to focus and defocus the beam at the sample surface 30 to be treated. The translation stage 28 can be manually operated or operated by robotic means or by a motor.

The body to be pretreated 30 is disposed on a sample translation stage 32. The body 30 critically has a metallic substrate, i.e., consists essentially of metal with perhaps only a coating of carbonaceous material such as wax or oil and/or perhaps only a coating of metal oxide on the substrate, or if a composite or laminate must have a metal surface with perhaps only a coating of carbonaceous material such as wax or oil and/or perhaps only a coating of metal oxide on the substrate or a filled metallic substrate, such as ceramic fiber reinforced aluminum with perhaps only a coating of carbonaceous material such as wax or oil and/or perhaps only a coating of metal oxide on the substrate. The body 30 is moved on the translation stage 32 relative to the beam 34. Preferably, the body 30 is moved perpendicular to the beam 34. The translation stage 32 can be operated by a stepping motor 38 or, alternatively, by a robotic means or by manual means (not shown). Preferably the translation stage 32 is a controlled X-Y translational stage or a combination translation stage-rotating wheel. Such items are easily available commercially, for example, from Velmex Company in Bloomfield, N.Y. Other means of moving the energy beam relative to the surface to be treated can include optical fibers attached to robot arms that have 2-6 degrees axis of freedom or industrial grade X-Y-Z gantry style platforms. It is convenient to control translation stage 32 with a driver 40 which in turn is operated by a computer 42. The computer 42 can easily control the number of pulses per area or the treatment duration when using a continuous wave laser on the body 30 and the amount of overlap between successive areas treated may be easily regulated. As long as the energy density for treating the surface is maintained, the relative movement between the laser beam path and the surface to be treated can be as fast as possible. Preferably, each area treated overlaps just a little with the area treated previously so that 100% treatment results. In many embodiments of the invention where there is a visible change in the surface resulting from the laser treatment, it is preferable that there is just a little overlap of the visibly affected areas from those areas previously treated. Once the body 30 has passed through the beam 34, a beam block 36 can be used to trap the beam 34. The invention can also incorporate more than one energy beam, e.g., two or more lasers. The term "energy beam" refers to one or more electromagnetic radiation beams and/or one or more particle beams. An example of a particle beam believed to be useful in this invention is an electron beam.

The energy beam or beams can be site-specific, that is, focused on a selected area of a surface, such as a metal surface with a high degree of accuracy to insure that the beams do not affect the appearance and/or other characteristics of neighboring surface areas, namely, of areas which do not require any treatment or whose treatment is already completed. The amount of energy transferred to an area of surface may be controlled by focusing or defocusing the energy beam, controlling the exposure time of the beam and adjusting the output power of the energy beam source. Any vaporized material may be easily exhausted from the treatment area using conventional exhaust, so as not to affect the health and/or comfort of the attendants and not to contribute to the pollution of the surrounding atmosphere.

The energy beam source must satisfy certain criteria. The first criterion is that the energy beam source must be capable of producing an extremely high energy density at the surface to be treated for a short period of time. For this invention, the critical parameter is absorbed energy rather than incident energy. However, absorbed energy is difficult to quantify and for the case where a laser is used as the beam source, the proportion of energy absorbed varies widely, for example, with differences in the material to be treated and the condition of the surface to be treated. The second criterion is that the absorbed energy must be converted into sufficient thermal energy to vaporize and/or melt the metallic substrate itself to form projections on the metallic substrate, substantially all of the projections being less than 20 micrometers in height as determined by microscopy, i.e., an occasional projection may extend upward from the treated surface by more than 20 micrometers but as shown in Example 28 it is believed that projections less than 20 micrometers in height are preferred for metallic substrates. The third criterion is that the energy beam applied to any specific area of the metallic substrate body must be applied for a relatively short time to control the depth of vaporization and/or melting of the metallic substrate, e.g., to prevent melt through or burn through of the metallic substrate.

Using either a pulsed laser or a continuous wave laser, or a plurality of lasers, the exposure time of the laser onto the body may be used to control the amount of energy directed to the surface of the body. The optimal exposure time and energy content of the energy beam depends upon the composition of the surface of the body, the shape of the surface of the body, the surface roughness of the body, the movement of the surface of the body relative to the beam, the angle the beam strikes the surface of the body, the type of laser being used, and on the ultimate application desired for the body being treated.

The preferred type of laser used in the invention depends on the specific application. Among the preferred lasers is a Q-switched Nd:YAG laser. It is believed that an excimer laser is also preferred.

Generally when a longer pulse time laser is used, the amount of laser energy focused onto a given area of the body per pulse needs to be increased. When using a laser having a pulse time between 1 and 100 nanoseconds, preferably the energy density of each laser pulse is in the range of from 0.005 to 100 joules/cm$^2$, and more preferably in the range of from 0.05 to 10 joules/cm$^2$ per pulse. When using a pulsed laser having a pulse time between 100 and 10,000 nanoseconds, preferably the energy density of each laser pulse is in the range of from 0.05 to 1,000 joules/cm$^2$ per pulse and more preferably in the range of from 0.5 to 100 joules/cm$^2$ per pulse. When using a laser having a pulse time between 10 and 1,000 microseconds, preferably the energy density of each laser pulse is in the range of from 5 and 10,000 joules/cm$^2$ per pulse and more preferably from 50 to 1,000 joules/cm$^2$ per pulse. When using a laser having a pulse time between 1 and 100 microseconds, preferably the energy density of each laser pulse is in the range of from 5 to 10,000 joules/cm$^2$ per pulse and more preferably from 50 to 1,000 joules/cm$^2$ per pulse. Similarly, when using a pulsed laser having a pulse time of 0.1 nanoseconds, it is believed that the preferred energy density of each laser pulse is in the range of from about 0.001 to about 5 joules/cm$^2$, and more preferably from 0.01 to 1 joules/cm$^2$ per pulse. When using a continuous wave laser, the relative rate of movement between the laser beam and the surface of the body to be treated, i.e., pretreated, and the intensity of the beam need to be controlled to similarly achieve beneficial modification. When using a continuous wave laser and a duration of treatment between 0.1 and 10 milliseconds, preferably the energy density is between 5 and 10,000 joules/cm$^2$ per duration time, and more preferably between 50 and 1,000 joules/cm$^2$ per duration time. When using a continuous wave laser and a duration of treatment between 10 and 1,000 milliseconds, preferably the energy density is between 10 and 20,000 joules/cm$^2$ per duration time and more preferably between 100 and 2,000 joules/cm$^2$ per duration time. When using a continuous wave laser and a duration of treatment between 0.001 and 0.1 millisecond, preferably the energy density is between 0.5 and 1,000 joules/cm$^2$ per duration time and more preferably between 5 and 100 joules/cm$^2$ per duration time. When using a continuous wave laser and a duration of treatment between 0.01 and 1 microsecond, preferably the energy density is between 0.05 and 1,000 joules/cm$^2$ per duration time and more preferably between 0.5 and 100 joules/cm$^2$ per duration time.

The determination of joules/cm$^2$ per pulse is made by interrelating two measurements. The first measurement is a determination of the specific laser beam energy per laser beam pulse. This measurement includes the use of a laser optical power meter as is well-known in the art. Generally, laser power meters show the average power of the laser beam in average watts. The number of average watts reported by the laser power meter is divided by the number of laser beam pulses per second to obtain the number of joules per pulse. The pulse time is that time over which about 66 percent of the beam energy is emitted by the laser. The second measurement is a determination of the area on the surface to be modified that is impacted by the laser beam. This measurement is made by placing Zap-It brand laser thermal sensitive paper (Kentek Inc., Manchester, N.H.), or an equivalent paper, on the surface to be treated followed by examination of the resulting visible effect of a single laser pulse. An envelope is drawn around the visibly affected area of the pulse and the area of the envelope is calculated as is well-known in the art of geometry. Finally, the number of joules per pulse is divided by the affected area in cm to obtain the joules/cm$^2$ per pulse.

The determination of joules/cm$^2$ per unit of treatment time for any one point using a continuous wave laser is made by interrelating two measurements. The first measurement is a determination of the laser beam power per cm. Using a laser optical power meter, the number of watts reported is divided by the area of the surface treated by the laser at any one time as determined above to obtain watts per cm$^2$. The second measurement is a calculation of the duration of exposure of any one point. The width of the treated area in cm at any one time in the direction of surface movement relative to the laser beam is divided by the relative movement velocity in cm per second. Then the watts per cm$^2$ is multiplied by the treatment duration to obtain the joules/cm$^2$ per unit of treatment duration.

In some applications it is desirable to pretreat only one for the two bodies to be bonded with the method of the present invention. For example, when bonding dissimilar bodies, one body may require pretreatment to enhance its performance to a level approximately equal to the other body not so-treated. Additionally, it is sometimes desirable to modify only one surface of a body to predispose a bond to fail in a predictable and beneficial manner not unlike the desire for rolled cellophane adhesive tape to come off its roll with the adhesive layer bonded to only one side of the cellophane.

The invention can be used to bond different materials where both surfaces are treated. As an example, it is not generally possible to spot weld aluminum to steel while the present invention can be used to enhance the adhesive bonding of aluminum to steel, galvanized steel to glass fiber reinforced plastic (SMC), aluminum to SMC, and other dissimilar materials generally without limitation.

The specific adhesive agent used is not critical in the invention as long as said adhesive agent coacts with the metallic substrate body pretreated according to this invention to produce an enhanced bond to the other body relative to the bond produced with a pretreatment of solvent washing the two bodies to be bonded. Specifically, the enhanced bond will show at least one of the following enhanced properties (and again relative to the bond produced with a pretreatment of solvent washing the two bodies to be bonded): at least a 20 percent stronger bond as demonstrated by a standard lap shear test; a more durable bond upon exposure to a sodium chloride solution/high humidity environment as demonstrated using the durability/lap shear test of Example 4: a more durable bond upon exposure to moisture as demonstrated by at least a 25 percent shorter crack extension in a modified standard crack extension wedge test; a stronger bond as demonstrated by at least a 25 percent shorter initial crack in a modified standard wedge test; at least a 20 percent higher pull strength as demonstrated by the ASTM 1876-72 peel test: at least a 20 percent higher impact strength as demonstrated by a modified ASTM D-256-81 impact test; or at least a 25 percent reduction in the area of bond failure at the interface between the adhesive and the bonded surface in any of the tests above with a commensurate increase in failure within the adhesive itself or in the bonded material. Preferred adhesives which work within the scope of the invention include urethanes, acrylics and epoxies. Other adhesives which work within the scope of the invention include silicone adhesives, cyanoacrylates and thermoplastic hot melts like polyimides. Alternatively, other hot melts, are believed to work within the scope and teaching of the present invention.

The specific curing conditions for the adhesive used in the invention are not critical. Generally, the curing conditions are recommended by the manufacturer of the adhesive for a given application. Preferably, the adhesive is applied to the modified surface with a minimum of delay in time. However, tests indicate that when a modified surface was kept covered (in a drawer), enhanced bonding performance was observed even when the adhesive was applied one week and later after surface modification.

With respect to the temperature at which enhanced bonding is proved by lap shear or wedge testing, said testing is generally done at room temperature but can also be done at temperatures higher or lower than room temperature, e.g., at 180° F. or at 0° F.

Urethane-based adhesives are well-known and widely used to adhere plastic and/or metal adherents together. The choice of urethane adhesives over other adhesives is based in part upon their outstanding characteristics with respect to bond strength, chemical inertness, tensile strength and handling characteristics.

One component of a urethane-based adhesive generally is an isocyanate-terminated prepolymer compound. Such a compound is normally prepared by reacting a polyisocyanate with a polyhydroxy compound or other compound containing labile hydrogen atoms that will give a positive Zerewitinoff test. The isocyanate group reacts with the labile hydrogen atom to form a urethane group. A molar excess of the isocyanate is added so that the resulting compound contains free isocyanate groups.

The other component of the urethane-based adhesive is generally a cross-linking mixture comprising an admixture of polyhydroxy compound free of isocyanate groups and selected urethane catalysts. When the two components are admixed, for example, in a high shear mixing head and then applied to a surface, a reactive hydrogen can interact with a free isocyanate group chain extended and cross-linked with an isocyanate-terminated prepolymer to form a cured adhesive.

Other adhesives which work within the scope and teachings of the present invention include epoxy adhesives. A variety of epoxy adhesives work within the scope of the present invention including those which are rapidly curable at elevated temperatures and especially adapted for use on automotive assembly lines to adhesively bond metal and/or polymeric parts. Numerous types of epoxy adhesives exist on the market, such as the epoxy described in U.S. Pat. Nos. 4,459,398; 4,467,071; and 4,485,229. Epoxies and epoxy resins which have increased adhesive strength contemplated for use within the present invention include epoxy resin formulations which are either pure or contain additives which enhance the properties of the epoxy resin. Exemplary enhanced epoxy resin compositions include those described in U.S. Pat. Nos. 4,002,598; 4,011,281: 4,139,524; 4,146,701; 4,147,857; 4,178,426; and 4,219,638. Curable epoxy resins which are polymerized by ionic addition mechanisms and often require high curing temperatures and long setting times can be used within the scope and teachings of the invention. Essentially, any epoxy adhesive capable of forming a tight polymer network, characterized by durability, good adhesion, good water, chemical and/or heat-resistant qualities can be used within the scope of the invention.

Additionally, combinations of epoxies and acrylic-based adhesives can be used. For example, the adhesive described in U.S. Pat. No. 3,684,617 dealing with an adhesive mixture of acrylic-based monomer and epoxy resin can be used within the scope of the invention. Also, a nonreactive composite adhesive described in U.S. Pat. No. 3,994,764 may be used within the scope of the invention.

Acrylic adhesives can work within the scope and teachings of the present invention. Acrylic adhesives which include polymers and copolymers formed from acrylic and methacrylic acids and their derivatives can be applied to the laser treated surface and provide the enhanced bonding properties. It is anticipated that a variety of other adhesives will also have utility within the defined invention. These adhesives include carboxylic polymeric adhesives, polysulfide adhesives, phenolic resin adhesives, amino resin adhesives, ethylene copolymer-based hot melt adhesives, polyvinyl acetal adhesives, anaerobic adhesives, polyamide adhesives and polyethylenimine-based adhesives.

These adhesives can optionally contain other materials. Other optional ingredients which can be added to either component include thickeners, stabilizers, flame retardants, metal particles, fibers, fillers, thixotropes and the like. The adhesives which are usable within the scope and teachings of the present invention can be prepared by a variety of methods, e.g., one- and/or two-part components using a variety of curing processes.

Adhesive materials can in some cases be used in conjunction with a primer as is well-known in the art. Here and in the claims such primers are considered to be adhesive agents.

The adhesive coating disposed on the surface of the material and treated in accordance with the inventive method, can form a more durable bond, as well as a stronger bond.

The pretreatment step of the present invention can be carried out in alternative environments, such as a protective atmosphere composed of nitrogen, or alternatively, an environment containing an inert gas, such as argon or alternatively in an environment containing a reactive gas such as hydrogen. It is contemplated that the inventive method could be practiced in an atmosphere containing a mixture of gases which would enhance the treatment of the surface for enhanced bonding.

Another embodiment of the present invention is to mold an object, such as a rubber gasket, to a body pretreated as for adhesive bonding as described above. It is believed that the cured molding compound, such as cured rubber, interlocks with the projections and/or exposed filler, such as a fiber reinforcing filler such as ceramic fiber used to reinforce aluminum, to produce a stronger bond between the object and the pretreated body. The specific molding compound used is not generally critical to the invention as long as it is moldable in its uncured state and includes thermoset and thermoplastic resins as well as casting resins such as epoxy and polyester resins. Elastomers believed useful, in this aspect of the invention include natural and synthetic rubbers (including silicone rubbers). The term "uncured" means not yet effectively cross-linked or for non-cross-linked elastomers (for example TPO rubbers) the term "uncured" means that the elastomer is heated sufficiently so that it is fluid and moldable.

The novel features which are considered as characteristic of the invention are set forth in particular in the appended claims. The apparatus for the practice of the method, both as to its construction and its mode of operation, together with additional features and advantages of the method will be better understood upon perusal of the above detailed description of certain specific embodiments with reference to the accompanying drawings and upon study of the following examples and comparative examples.

EXAMPLE 1

The apparatus for treating, i.e., pretreating, a metallic substrate body for enhanced adhesion includes a Q-switched Quanta-Ray Nd:YAG model No. DCR-2 laser which produces 30 pulses per second. The laser produces radiation at a wavelength of 1.06 microns with a maximum average power of about 18 watts.

The laser beam is directed at the body to be treated by a system of optical components. The components route and focus the beam. The components are constructed of high quality quartz, S1-UV grade. The beam is directed by 90 degree prisms ESCO model No. 1125250 and focused to a line image about ½ inch long by a cylindrical 50-cm focal length lens, ESCO model No. B1-20100.

The bodies to be treated, 1×4 inch solvent cleaned (the term "solvent cleaned" in this and all examples herein means rinsing three times with methylene chloride unless otherwise indicated) 2024-T3 aluminum alloy panels 1/16 of an inch thick, are placed in a holder on a translation stage synchronized with the laser pulse repetition rate and translated through the beam. The translation apparatus includes a Velmex Unislide A4000 series translation stage. The slide of the translation apparatus is driven by a stepping motor from Superior Electric, model M061-FD08. The stepping motor is controlled by a Superior Electric model STM 103 controller and the controller is operated by a Commodore 64 computer for complex maneuvers or manually operated.

The panels are translated through the laser beam path at 18 mm/sec and the final ½-inch portion of each panel is treated. The lens to panel distance is 35 cm.

Four pairs of panels are treated at each of several energy density levels between 0.14 and 2.16 joules/cm$^2$ per pulse. Each panel pair is then bonded together applying a high strength two-part urethane adhesive cured at 135° C. for 45 minutes (Dow XPR No. 0544-00923-05-1 urethane adhesive systems) containing 0.5 percent, 0.004-inch diameter glass beads to insure an evenly spaced "glue line" as is well-known in the art, only to the treated portion of each panel with a ½×1 inch lap joint of the panel ends. Table I lists the lap shear strength (measured using ASTM test D-1002) of each panel pair so bonded in relation to laser energy density. The lap shear strength of the panels treated with 0.8 to 2.3 joules/cm$^2$ per pulse (to form projections on the aluminum substrate, the projections formed by evaporation and/or melting of the aluminum substrate, substantially all of the projections being less than 20 micrometers in height) is about 50 percent higher than those with no treatment or laser treatment with 0.4 and 0.6 joules/cm$^2$ per pulse (which do not result in the formation of projections on the aluminum panels). The lap shear strength shown in Table I is an average of four tests and generally such tests show a statistical variation (relative standard deviation) of about ±10 percent. Unless otherwise indicated, all examples herein involved testing in quadruplicate at any one laser energy density treatment.

TABLE I

LAP SHEAR TESTING OF LASER TREATED ALUMINUM PANELS BONDED TOGETHER WITH A URETHANE ADHESIVE

| Laser Energy Density, Joules/cm$^2$ per pulse | Lap Shear Strength, psi |
|---|---|
| 0 | 2,300 |
| 0.4 | 2,200 |
| 0.6 | 2,500 |
| 0.8 | 3,300 |
| 1.0 | 3,800 |
| 1.2 | 3,800 |
| 1.7 | 3,500 |
| 2.3 | 3,600 |

EXAMPLE 2

The apparatus of Example 1 is used in conjunction with 1×4 inch solvent cleaned magnesium panels 1/16 inch thick prepared as cold chamber die-cast magnesium alloys of type AZ 91B produced by The Dow Chemical Company. This alloy contains 9 percent aluminum and 1 percent zinc. The sample to lens distance is 25 cm.

The samples are moved through the beam at a rate of 15 mm/sec to form projections on the magnesium substrate, the projections formed by evaporation and/or melting of the magnesium substrate, substantially all of the projections being less than 20 micrometers in height including sub-micron sized projections on the micron sized projections which are believed to be benificial when bonding magnesium and other metals where sub-micron projections are so-formed. These magnesium alloy panels are then bonded and tested as in Example 1. The results listed in Table II show that lap shear strength increases with increased laser energy density. The bond strength increases approximately 60 percent over that obtained from the untreated panels.

TABLE II

LAP SHEAR TESTING OF LASER TREATED MAGNESIUM PANELS BONDED TOGETHER WITH A URETHANE ADHESIVE

| Laser Energy Density, Joules/cm$^2$ per pulse | Lap Shear Strength, psi |
|---|---|
| 0 | 1,200 |
| 0.1 | 1,600 |
| 0.3 | 1,700 |
| 0.4 | 2,000 |
| 0.8 | 1,800 |
| 1.2 | 2,200 |

EXAMPLE 3

The apparatus of Example 1 is used in connection with 1×4 inch hot dip zinc galvanized steel panels (Deep DQSK, G-60 automotive grade) 1/33 inch thick. The panels are immersed in a water-based oil emulsion, H. A. Montgomery No. DF-4285 and allowed to drain for a period of 15 to 45 minutes. The panels are translated through the laser beam at 7.4 mm/sec. The sample to lens distance was 50 cm.

These galvanized steel panels are then bonded and tested as in Example 1. The lap shear strength of the bonded panels versus the laser energy density is listed in Table III. Laser treatment in the energy density range of from 1.2 to 5.2 joules/cm$^2$ per pulse to form projections on the zinc substrate, the projections formed by evaporation and/or melting of the zinc substrate, substantially all of the projections being less than 20 micrometers in height, produced an increase in bond strength of almost an order of magnitude over that of the untreated material. As the laser power increases to 1.2 joules/cm$^2$ per pulse, the lap shear strength increases to about 2,000 psi and remains at about that level for higher laser energy densities. The lap shear strength of nonoiled solvent cleaned panels of galvanized steel is about 1,300 psi.

TABLE III

LAP SHEAR TESTING OF LASER TREATED OILED GALVANIZED STEEL PANELS BONDED TOGETHER WITH A URETHANE ADHESIVE

| Laser Energy Density, Joules/cm$^2$ per pulse | Lap Shear Strength, psi |
|---|---|
| 0 | 300 |
| 1.2 | 1,000 |
| 1.4 | 2,100 |
| 1.9 | 1,700 |
| 2.4 | 2,000 |

TABLE III-continued

LAP SHEAR TESTING OF LASER
TREATED OILED GALVANIZED STEEL PANELS
BONDED TOGETHER WITH A URETHANE ADHESIVE

| Laser Energy Density, Joules/cm² per pulse | Lap Shear Strength, psi |
|---|---|
| 2.8 | 1,900 |
| 3.3 | 2,100 |
| 5.2 | 2,000 |

EXAMPLE 4

The apparatus of Example 1 also can be used to improve the durability of bonding. Thirty-two sets of 4 hot dip zinc galvanized steel panels are first pretreated with an oil emulsion as in Example 3. Two of the panels of galvanized steel in each set are then translated through the laser beam at 7.4 mm/sec using a sample to lens distance of 50 cm and a laser energy density of approximately 1.60 joules/cm² per pulse to form projections on the zinc substrate, the projections formed by evaporation and/or melting of the zinc substrate, substantially all of the projections being less than 20 micrometers in height. The other two panels of each set are not treated with the laser and instead are solvent cleaned to remove the oil. Table IV shows the bond strength of laser treated and solvent cleaned panels bonded together as in Example 1 versus the length of time the panels are exposed to a moist salty environment in a test known as the General Motors Scab Corrosion Test. This test is performed over a period of 32 days and involves testing the lap shear strength of the panels bonded as in Example 1. This experiment involves 32 cycles, where for each cycle, the bonded panels are placed for 22.5 hours in a cabinet with a relative humidity of 85 percent and a temperature of 145° F., followed by 0.25 hour immersion in a 5 weight percent NaCl solution in water and then 1.25 hours in a dry, room temperature area followed by a test of lap shear strength. After 7 cycles, the test results reveal that the untreated panels lost all lap shear strength and fell apart. In contrast, the laser treated panels maintain a bond for 32 days at a strength of at least 500-600 psi.

TABLE IV

BOND DURABILITY UPON EXPOSURE TO
MOISTURE AND SALT FOR LASER TREATED AND
SOLVENT CLEANED GALVANIZED STEEL PANELS

| Days of Exposure | Lap Shear Strength in psi for the Solvent Cleaned Panels [1] | Lap Shear Strength in psi for the Laser Treated Panels [1] |
|---|---|---|
| 0 | 1,300 | 2,000 |
| 1 | 600 | 1,400 |
| 4 | 600 | 1,400 |
| 7 | 0 | 1,300 |
| 14 | 0 | 1,300 |
| 18 | 0 | 900 |
| 25 | 0 | 600 |
| 28 | 0 | 500 |
| 32 | 0 | 600 |

[1] Note, these data are the average of 2-3 determinations.

EXAMPLE 5

The apparatus of Example 1 is used in conjunction with hot dip zinc galvanized steel panels (Deep DQSK, G-60 automotive grade) and an acrylic adhesive. (Hardman red/white two-part acrylic adhesive, cured at 325° F. for 30 minutes). The galvanized steel panels are treated with an oil emulsion as in Example 3 prior to laser treatment. The sample to lens distance is 35 cm, the sample translation is 15 mm/sec through the laser beam and the laser energy density is 0.6 joules/cm² per pulse to form projections on the zinc substrate, the projections formed by evaporation and/or melting of the zinc substrate, substantially all of the projections being less than 20 micrometers in height. The oily galvanized panels with no laser treatment before bonding have a bond strength of about 900 psi. The laser treated panels have a bond strength of approximately 1,600 psi. This result represents over a 75 percent increase in bond strength for the laser treated panels bonded with acrylic adhesive in comparison with untreated panels bonded with acrylic adhesive.

EXAMPLE 6

Figure 3:
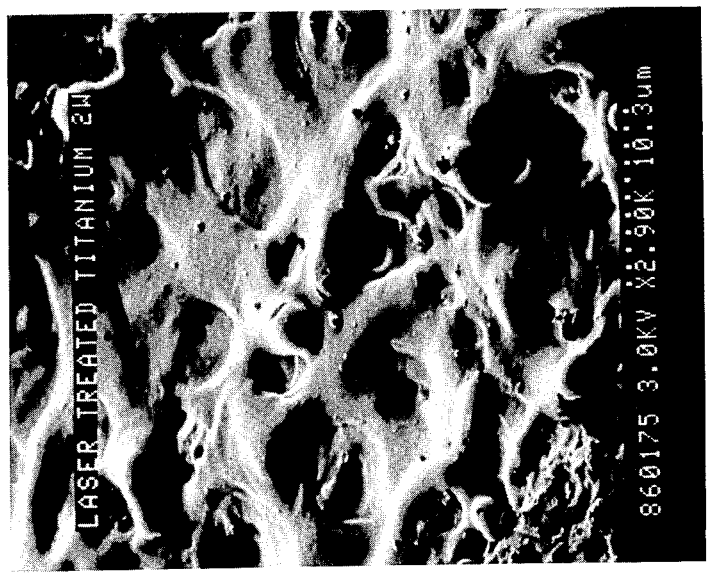
FIGS. 3A-3B show photomicrographs of laser treated titanium of Example 11.
Figure 3:
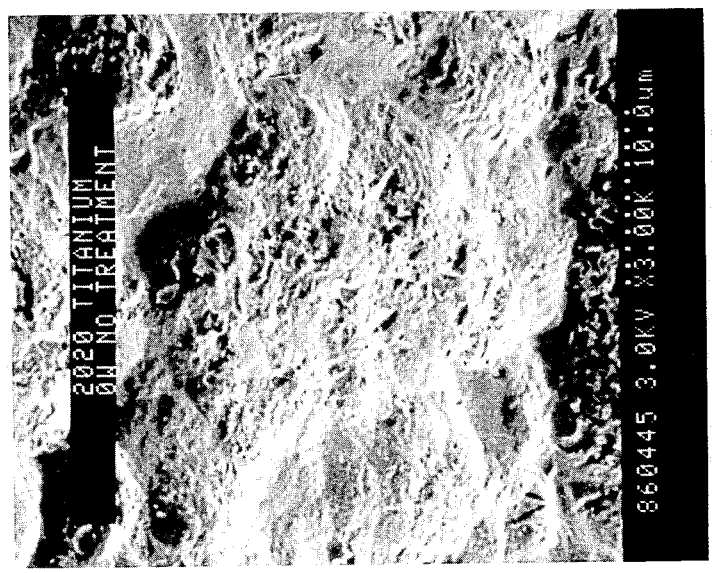

In Examples 1-5 the test method is ASTM D-1002 for lap shear strength. In this example and in many of the following examples the test method is wedge test ASTM D-3762, modified as described below. In the modified ASTM D-3762 test, 1×4 inch metal panels ⅛ inch thick are bonded together with an adhesive and then a wedge is forced between the panels as shown in FIG. 3. The initial crack length is a function of several factors including the tensile strength of the bond. The bond strength can be so poor that the test panels fall apart, i.e., an initial crack length in excess of 3 inches. After measuring the initial crack length, the wedged panels, with wedge in place, are placed in a 49° C., 100 percent relative humidity environment for 75 minutes or longer and then the crack growth after exposure (herein termed "crack extension") is measured. If the bond has poor resistance to moisture, then the crack extension can be large and again if large enough the test panels can fall apart. The percent relative standard deviation precision of the wedge test is generally believed to be about ±12 percent.

The system of Example 1 is used to laser treat solvent cleaned 2024-T3 aluminum alloy panels. The cylindrical lens is changed to one having a 25-cm focal length and the panels are placed 21 cm from this lens. Between the laser and the cylindrical lens is placed a polarizing filter. By adjusting the polarizing filter, different laser power can be directed upon the panels while operating the laser itself at full power (18 watts).

The panels are translated back and forth through the laser beam at 12 mm/sec to completely treat one side of each panel with about a 150 percent overlap of each pulse treated area. The treated surface of each panel is then coated with American Cyanamid epoxy primer No. BR-127, cured at 250° F. for 1 hour and bonded to an identically treated panel with 3M epoxy adhesive No. AF-163-2, OST, Grade 5, cured at 250° F. for 1.5 hours under vacuum at 100 psi and wedge tested.

As listed in Table V, with no laser treatment the initial crack is about 37 mm and this crack grew about 30 mm upon exposure to moisture. At 0.7 to 1.6 joules/cm² of laser energy per pulse to form projections on the aluminum substrate, the projections formed by evaporation and/or melting of the aluminum substrate, substantially all of the projections being less than 20 micrometers in height, the initial crack is significantly reduced and the crack grew only about 2 mm to about 5 mm upon exposure to moisture; a significant improvement in both bond strength and bond durability upon exposure to moisture according to the wedge test.

TABLE V
WEDGE TESTING OF LASER TREATED ALUMINUM PANELS BONDED TOGETHER WITH AN EPOXY ADHESIVE

| Laser Energy Density, Joules/cm² per pulse | Initial Crack Length, mm | Crack Extension, mm |
|---|---|---|
| 0.0 | 37 | 30 |
| 0.7 | 12 | 5 |
| 0.8 | 12 | 2 |
| 1.1 | 13 | 2 |
| 1.4 | 12 | 2 |
| 1.6 | 12 | 2 |

EXAMPLE 7

This is a comparative example of several prior art surface preparation techniques. Panels of solvent cleaned 2024-T3 aluminum alloy are sanded with 80, 320 or 600 grit sandpaper (190, 29 and 17 microns, respectively), polished with 5 μ alumina, sandblasted with 54 grit aluminum oxide, or wire brushed with 13 mil wire. The soxhlet cleaned panels are placed in a Whatman LTD cellulose soxhlet thimble and soxhlet extracted with toluene for 4 hours (∼37 rinse cycles). The panels are then coated with American Cyanamid epoxy primer No. BR-127 and bonded together with 3M epoxy adhesive No. AF-163-2 as in Example 7 and then wedge tested, see Table VI.

TABLE VI
WEDGE TESTING OF LASER TREATED ALUMINUM PANELS BONDED TOGETHER WITH AN EPOXY ADHESIVE

| Surface Treatment | Initial Crack Length, mm | Crack Extension, mm |
|---|---|---|
| 80 Grit Sandpaper | 24 | 21 |
| 320 Grit Sandpaper | 22 | 22 |
| 600 Grit Sandpaper | 17 | 15 |
| Polished Surface | 49 | >27 [1] |
| Sandblasted | 15 | 14 |
| Wire Brushed | 20 | 15 |
| Solvent Cleaned | 36 | >41 [1] |
| Soxhlet Cleaned | 30 | >47 [1] |

[1] Panels fell apart in the humidity Cabinet.

The data in Table VI, when compared to the results obtained using the present invention, see Example 6, demonstrate the superiority of the present invention over the surface treatments listed in Table VI as indicated by the wedge test.

EXAMPLE 8

The system of Example 6 is used to again treat solvent cleaned 2024-T3 aluminum alloy panels except that the polarizing filter is removed and the laser power is adjusted as in Example 1. The panels are placed about 25 cm from the 25-cm focal length cylindrical lens to form projections on the aluminum substrate, the projections formed by evaporation and/or melting of the aluminum substrate, substantially all of the projections being less than 20 micrometers in height.

The degree of overlap of the area covered by each laser pulse is about 150 percent. The pulse time of the laser depends on the power setting, being about 10 nanoseconds above 6 watts and from 10 to 40 nanoseconds between ½ watt and 6 watts, see Table VII.

TABLE VII
PULSE TIME OF THE LASER USED AS A FUNCTION OF ENERGY DENSITY AND OUTPUT POWER

| Laser Power in Watts/Sec | Laser Energy Density, Joules/cm² per pulse | Pulse Time in Nanoseconds |
|---|---|---|
| 0.5 | 0.7 | 40 |
| 1 | 0.8 | 25 |
| 2 | 1.1 | 20 |
| 3 | 1.4 | 16 |
| 4 | 1.6 | 12 |
| 5 | 1.9 | 11 |
| 6 | 2.2 | 10 |
| 10 | 3.3 | 10 |
| 15 | 4.7 | 10 |
| 18 | 5.5 | 10 |

The data in Table VII is provided to allow conversion from laser power to energy density and pulse time for the conditions described above. The following Table VIII shows example data of enhanced bonding characteristics.

The treated aluminum panels are then coated with American Cyanamid epoxy primer No. BR-127 and bonded together with 3M epoxy adhesive No. AF-163-2 as in Example 6 and then wedge tested, see Table VIII.

TABLE VIII
WEDGE TESTING OF LASER TREATED ALUMINUM PANELS BONDED TOGETHER WITH AN EPOXY ADHESIVE

| Laser Energy Density, Joules/cm² per pulse | Initial Crack Length, mm | Crack Extension, mm |
|---|---|---|
| 0.0 | 40 | 30 |
| 0.7 | 19 | 20 |
| 0.8 | 12 | 1 |
| 1.1 | 12 | 1 |
| 1.4 | 11 | 1 |
| 1.9 | 12 | 1 |
| 2.7 | 11 | 3 |

The data in Table VIII indicate that even at a laser energy density of 0.7 joules/cm² per pulse, the bond strength and durability is improved relative to the non-laser treated panels.

Figure 2:
FIG. 2A-2B shows photomicrographs of laser treated aluminum of Example 8.
Figure 2:
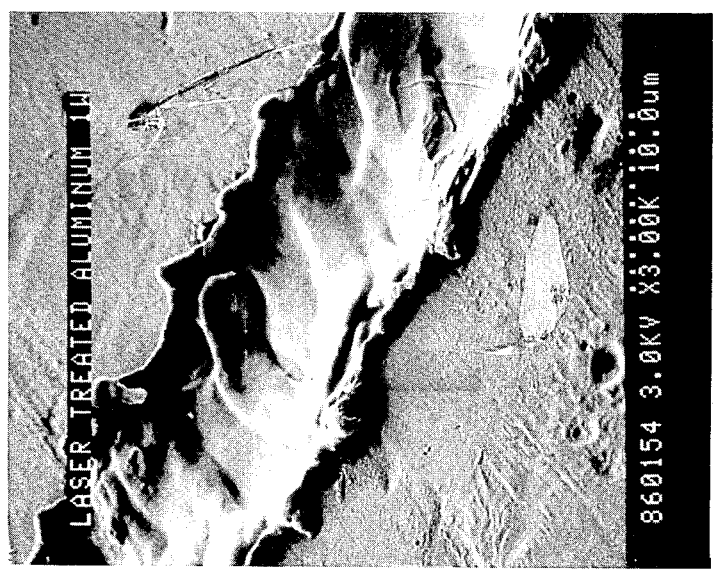

FIG. 2A-2B show electron photomicrographs of aluminum treated with: (a) a single 0.8 joules/cm² pulse, shown at 3,000× magnification; and (b) an aluminum surface showing overlapping 2.7 joules/cm² pulses, shown at 1500× magnification. These photomicrographs show projections on the aluminum substrate, the projections formed by evaporation and/or melting of the aluminum substrate, substantially all of the projections being less than 20 micrometers in height.

Optimization of economic factors using the invention can result from using full laser power with a defocused laser beam to treat a larger area of surface with each pulse. In this event, the linear velocity of relative movement between the laser beam and the surface to be treated can be higher and still effectively treat the surface for enhanced bonding characteristics.

EXAMPLE 9

The system of Example 8 is used to treat panels of solvent cleaned 304 grade stainless steel to form projections on the stainless steel substrate, the projections formed by evaporation and/or melting of the stainless steel substrate, substantially all of the projections being less than 20 micrometers in height. The treated panels are then coated with American Cyanamid epoxy primer No. BR-127 and bonded together with 3M epoxy adhesive No. AF-163-2 as in Example 6 and then wedge tested, see Table IX.

TABLE IX

WEDGE TESTING OF LASER TREATED STAINLESS STEEL PANELS BONDED TOGETHER WITH AN EPOXY ADHESIVE

| Laser Energy Density, Joules/cm$^2$ per pulse | Initial Crack Length, mm | Crack Extension, mm |
|---|---|---|
| 0 | 15 | 22 |
| 1.4 | 17 | 7 |
| 2.7 | 8 | 1 |
| 5.5 | 17 | 3 |

The data in Table IX show that optimum bond strength as indicated by initial crack length requires a specific treatment power range while bond durability as indicated by crack extension is improved at all laser power levels tested.

EXAMPLE 10

The system of Example 8 is used to treat panels of solvent cleaned hot dip zinc galvanized steel (Deep DQSK, G-60 automotive grade) to form projections on the zinc substrate, the projections formed by evaporation and/or melting of the zinc substrate, substantially all of the projections being less than 20 micrometers in height. The treated panels are then coated with American Cyanamid epoxy primer No. BR-127 and bonded together with 3M epoxy adhesive No. AF-163-2 as in Example 6 and then wedge tested, see Table X.

TABLE X

WEDGE TESTING OF LASER TREATED GALVANIZED STEEL PANELS BONDED TOGETHER WITH AN EPOXY ADHESIVE

| Laser Energy Density, Joules/cm$^2$ per pulse | Initial Crack Length, mm | Crack Extension, mm |
|---|---|---|
| 0.0 | 11 | 2.0 |
| 1.4 | 2 | 0.3 |
| 2.7 | 2 | 0.2 |
| 5.5 | 4 | 0.3 |

The data in Table X show laser treatment improves both initial crack length and crack extension for galvanized steel under the conditions studied. However, it should be noted that the laser treated panels curled back upon wedge entry and thus the only conclusion believed to be shown by the data in Table X is that laser treatment improved bond strength.

EXAMPLE 11

The system of Example 8 is used to laser treat panels of wire brushed and nonbrushed solvent cleaned Ti$_6$Al$_4$ titanium alloy to form projections on the titanium substrate, the projections formed by evaporation and/or melting of the titanium substrate, substantially all of the projections being less than 20 micrometers in height. The treated panels are then coated with American Cyanamid epoxy primer No. BR-127 and bonded together with 3M epoxy adhesive No. AF-163-2 and then wedge tested, see Table XI.

TABLE XI

WEDGE TESTING OF LASER TREATED TITANIUM PANELS BONDED TOGETHER WITH AN EPOXY ADHESIVE

| Laser Energy Density, Joules/cm$^2$ per pulse | Initial Crack Length, mm | Crack Extension, mm |
|---|---|---|
| 0.0 | 24 [1] | 36 [1] |
| 0.0 | 20 [2] | 8 [2] |
| 1.4 | 20 | 4 |
| 2.7 | 22 | 4 |
| 5.5 | 24 | 11 |

[1] Not wire brushed.
[2] Wire brushed.

The data in Table XI show no improvement in bond strength at the laser powers tested as indicated by initial crack length. However, an improvement in bond durability is seen at 1.4 and 2.7 joules/cm$^2$ per pulse of laser energy as indicated by the crack extension data in Table XI.

FIGS. 3A-3B show electron photomicrographs of: (a) the titanium alloy before laser treatment at 3,000× magnification: and (b) after laser treatment with a single 1.4 joules/cm$^2$ pulse at 2,900× magnification that also shows evidence of apparent surface melting to form projections on the titanium substrate, the projections formed by evaporation and/or melting of the titanium substrate, substantially all of the projections being less than 20 micrometers in height.

EXAMPLE 12

The system of Example 9 is used to treat panels of solvent cleaned 15 microinch surface ground cold rolled steel in this comparative example. The treated panels are then coated with American Cyanamid epoxy primer No. BR-127 and bonded to an identically treated panel with 3M epoxy adhesive No. AF-163-2 as in Example 6 and then wedge tested, see Table XII.

TABLE XII

WEDGE TESTING OF LASER TREATED COLD ROLLED STEEL PANELS BONDED TOGETHER WITH AN EPOXY ADHESIVE

| Laser Energy Density, Joules/cm$^2$ per pulse | Initial Crack Length, mm | Crack Extension, mm |
|---|---|---|
| 0.0 | 20 | 7 |
| 2.2 | 22 | 6 |
| 2.7 | 24 | 6 |
| 3.8 | 23 | 7 |
| 5.5 | 22 | 7 |

The data in Table XII show no significant improvement in either initial crack length or in crack extension under the conditions studied. When the solvent cleaned ground cold rolled steel panels are treated as listed in Table XII, bonded using a urethane adhesive as in Example 1 and subjected to the lap shear test, no significant improvement in lap shear strength results.

Photomicrographs of the 5.5 joules/cm$^2$ per pulse laser treated ground steel surface showed a general smoothing of the surface, relative to the untreated ground surface, with evidence of overall apparent surface melting without the apparent formation of projections.

EXAMPLE 13

The system of Example 8 is used to laser treat panels of solvent cleaned mirror smooth chrome plated steel to form projections on the chrome/steel substrate, the projections formed by evaporation and/or melting of the chrom/steel substrate, substantially all of the projections being less than 20 micrometers in height. The treated panels are then coated with American Cyanamid epoxy primer No. BR-127 and bonded together with 3M epoxy adhesive No. AF-163-2 as in Example 7 and then wedge tested, see Table XIII.

TABLE XIII

WEDGE TESTING OF LASER TREATED CHROME PLATED STEEL PANELS BONDED TOGETHER WITH AN EPOXY ADHESIVE

| Laser Energy Density, Joules/cm² per pulse | Initial Crack Length, mm | Crack Extension, mm |
|---|---|---|
| 0.0 | 45 | 13 |
| 0.8 | 6 | 0 |
| 1.4 | 6 | 0 |
| 2.7 | 14 | 3 |
| 5.5 | 16 | 6 |

The data in Table XIII show that under the conditions studied both bond strength and bond durability are improved by laser treatment as indicated by the wedge test.

EXAMPLE 14

The laser of Example 8 is replaced with an excimer laser having a wavelength of 0.249 micron, a pulse width of about 10 nanoseconds, a pulse frequency of 30 Hertz and a maximum power of 6 watts. The excimer laser is used to treat panels of aluminum, stainless steel and copper at a laser energy density of approximately 10 and 0 joules/cm² per pulse. At approximately 10 joules/cm² per pulse, projections are formed that are substantially all less than 20 micrometers in height. The treated surface of each panel is then coated with American Cyanamid epoxy primer No. BR-127 and bonded to an identically treated panel of the same metal with 3M epoxy adhesive No. AF-163-2 and then wedge tested. In each case, the laser treatment at approximately 10 joules/cm² per pulse significantly enhances the bonding characteristics of the panels as indicated by the wedge test.

EXAMPLE 15

The system of Example 8 is used to treat panels of solvent cleaned 2024-T3 aluminum alloy panels. In this example the Q-switch of the laser is turned off and as a result the laser pulse length is about 100 microseconds. The cylindrical lens is replaced with a conventional converging lens and the laser pulse is focused to a spot 0.6 mm in diameter on the object to be treated in order to compensate for the longer laser pulse length. The translation stage is controlled so that there is about 150 percent coverage of the panel surface with the laser pulses. The treated panels are then coated with American Cyanamid epoxy primer No. BR-127 and bonded to an identically treated panel with 3M epoxy adhesive No. AF-163-2 as in Example 6 and then wedge tested, see Table XIV.

TABLE XIV

WEDGE TESTING OF LASER TREATED ALUMINUM PANELS BONDED TOGETHER WITH AN EPOXY ADHESIVE

| Laser Energy Density, Joules/cm² per pulse | Initial Crack Length, mm | Crack Extension, mm |
|---|---|---|
| 0 | 37 | 39 |
| 140 | 30 | 48 |
| 210 | 15 | 10 |

The data in Table XIV indicate that significant enhancement of bond characteristics was observed at the highest laser power studied as indicated by the wedge test and only at this power were projections formed on the aluminum substrate and they were all substantially less than 20 micrometers in height. This example demonstrates the successful use of a relatively long pulse duration laser in the invention.

Comparing the data in Table XIV (Q-switch off) with the data in Table VIII and Table VIII (Q-switch on) indicate that delivering a given laser energy density in a relatively short pulse (Q-switch on) is more efficient than a relatively long pulse (Q-switch off) in forming projections on the substrate.

EXAMPLE 16

The system of Example 8 is used to treat panels of solvent cleaned 2024-T3 aluminum alloy panels to form projections on the aluminum substrate, the projections formed by evaporation and/or melting of the aluminum substrate, substantially all of the projections being less than 20 micrometers in height. The treated panels are then bonded together with Locktite Super Bonder 495 cyanoacrylate-type adhesive containing 0.5 percent, 0.004 inch diameter glass beads to insure an evenly spaced "glue line" as is well-known in the art.

TABLE XV

WEDGE TESTING OF LASER TREATED ALUMINUM PANELS BONDED TOGETHER WITH A CYANOACRYLATE ADHESIVE

| Laser Energy Density, Joules/cm² per pulse | Initial Crack Length, mm | Crack Extension, mm |
|---|---|---|
| 0.0 | 54 | >23 1 |
| 1.5 | 36 | 3 |

1 Panels fell apart in the humidity cabinet.

The data in Table XV show that both the initial crack length and crack extension are improved with the laser treatment.

EXAMPLE 17

The system of Example 9 is used to treat panels of solvent cleaned, bonderized, (phosphate treated) electrogalvanized steel to form projections on the zinc substrate, the projections formed by evaporation and/or melting of the zinc substrate, substantially all of the projections being less than 20 micrometers in height. The treated panels are then coated with American Cyanamid epoxy primer No. BR-127 and bonded to an identically treated panel with 3M epoxy adhesive No. AF-163-2 as in Example 6 and then wedge tested, see Table XVI.

TABLE XVI

WEDGE TESTING OF LASER TREATED BONDERIZED ELECTROGALVANIZED STEEL PANELS BONDED TOGETHER WITH AN EPOXY ADHESIVE

| Laser Energy Density, Joules/cm² per pulse | Initial Crack Lenth, mm | Crack Extension, mm |
|---|---|---|
| 0.0 | 8.0 | 2.2 |
| 0.8 | 7.6 | 0.7 |
| 1.4 | 8.1 | 0.0 |
| 2.7 | 8.2 | 0.0 |
| 5.5 | 6.7 | 0.4 |

The data in Table XVI indicate that although bond strength was not significantly improved by laser treatment as indicated by the initial crack length, bond durability was significantly improved as indicated by the crack extension under the conditions studied.

EXAMPLE 18

The system of Example 8 is used to laser treat panels of solvent cleaned pure tin. The treated panels are then coated with American Cyanamid epoxy primer No. BR-127 and bonded together with 3M epoxy adhesive No. AF-163-2 as in Example 6 and then peel tested using the ASTM 1876-72 peel test, see Table XVII.

TABLE XVII

PEEL TESTING OF LASER TREATED TIN PANELS BONDED TOGETHER WITH AN EPOXY ADHESIVE

| Laser Energy Density, Joules/cm$^2$ per pulse | Peel Strength, Pounds per Linear Inch |
| --- | --- |
| 0 | 3.6 |
| 1.4 | 8.9 |
| 2.7 | 7.0 |
| 5.5 | 3.5 |

The data in Table XVII show that at the intermediate laser energy densities per pulse, the peel strength is significantly improved relative to no laser treatment.

Figure 4:
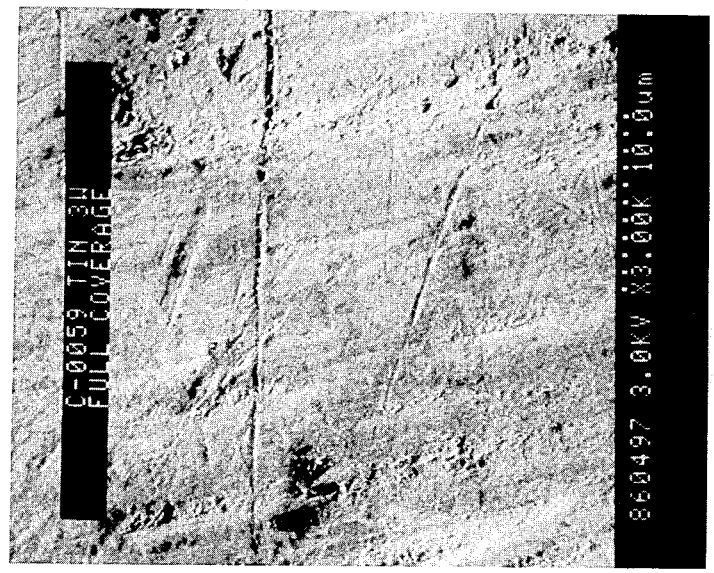
FIGS. 4A-4C show photomicrographs of laser treated tin of Example 18.
Figure 4:
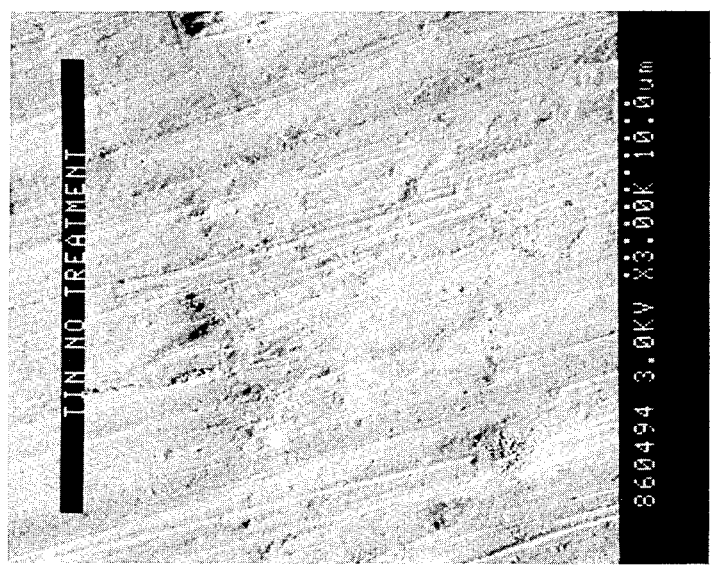
Figure 4:
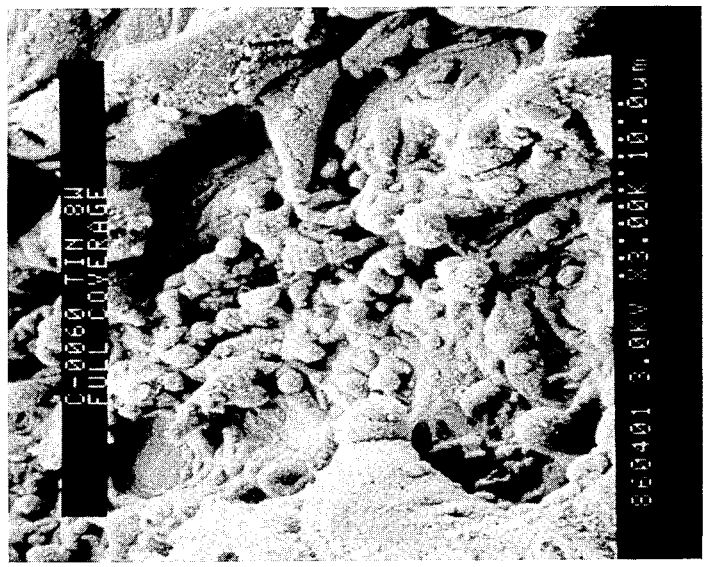

FIGS. 4A-4C show 3,000× magnification electron photomicrographs of tin: (a) before laser treatment (b) after overlapping treatment with 1.4 joules/cm$^2$ laser pulses without apparent formation of projections on the tin substrate: and (c) after overlapping treatment with 2.7 joules/cm$^2$ laser pulses with the formation of projections on the tin substrate substantially all of which are less than 20 micrometers in height. Although there is no significant apparent difference between FIGS. 4(a) and 4(b), the data in Table XVII indicates that the surface shown in FIG. 4(b) was apparently beneficially modified even though there is no apparent surface melting and roughening of the type shown in FIG. 3(b) or FIG. 2(a). FIG. 4(c) does show evidence of apparent surface melting and/or vaporization with the formation of projections, supra.

EXAMPLE 19

The system of Example 8 is used to laser treat panels of solvent cleaned mill finish cold rolled steel (surface not ground) to form projections on the steel substrate, the projections formed by evaporation and/or melting of the steel substrate, substantially all of the projections being less than 20 micrometers in height. The treated panels are then coated with American Cyanamid epoxy primer No. BR-127 and bonded together with 3M epoxy adhesive No. AF-163-2 as in Example 6 and then wedge tested, see Table XVIII.

TABLE XVIII

WEDGE TESTING OF LASER TREATED COLD ROLLED STEEL PANELS BONDED TOGETHER WITH AN EPOXY ADHESIVE

| Laser Energy Density, Joules/cm$^2$ per pulse | Initial Crack Length, mm | Crack Extension, mm |
| --- | --- | --- |
| 0.0 | 26 | 24 |
| 0.8 | 13 | 2 |
| 1.4 | 12 | 1 |
| 2.7 | 12 | 2 |
| 5.5 | 11 | 4 |

The data in Table XVIII indicate that the laser treatments studied resulted in stronger and more durable bonds as indicated by the wedge test relative to no laser treatment.

Figure 5:
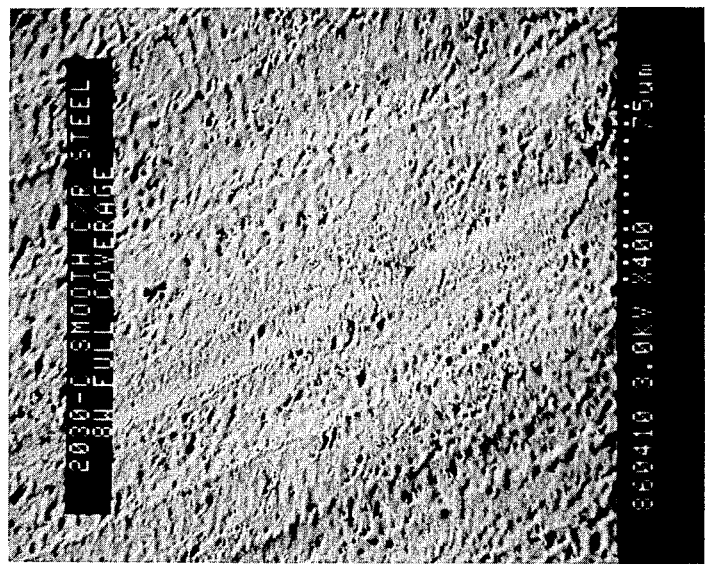
FIGS. 5A-5D show photomicrographs of laser treated cold rolled steel of Example 19.
Figure 5:
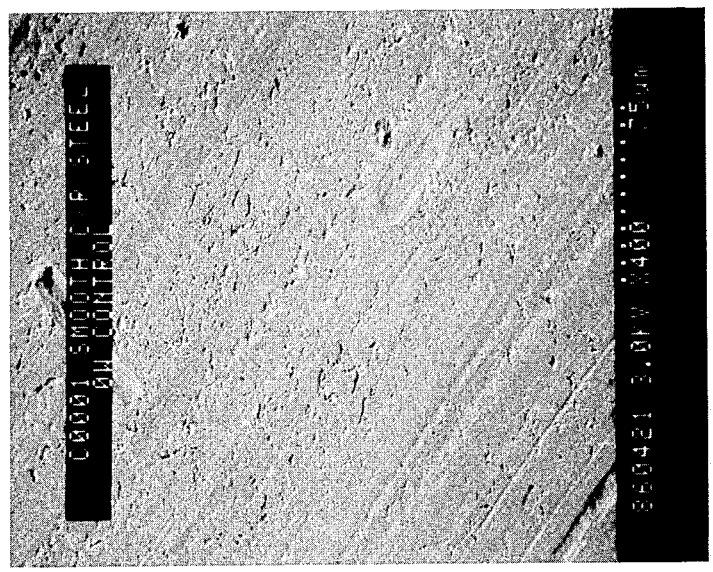
Figure 5:
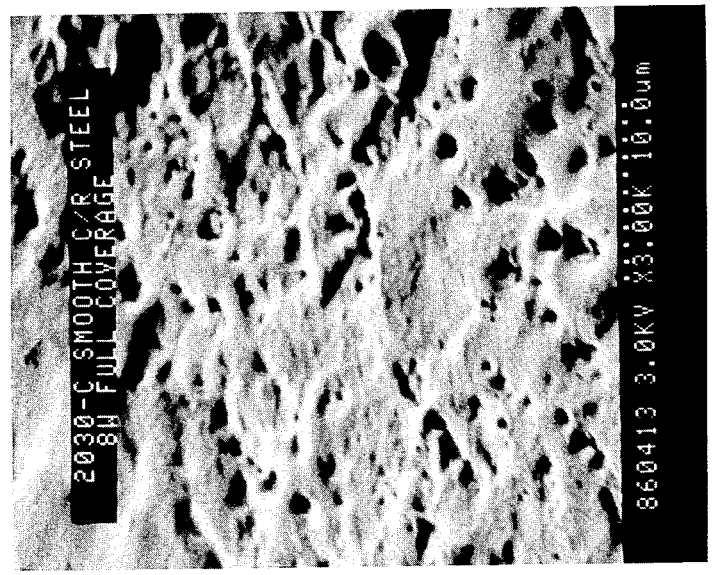
Figure 5:
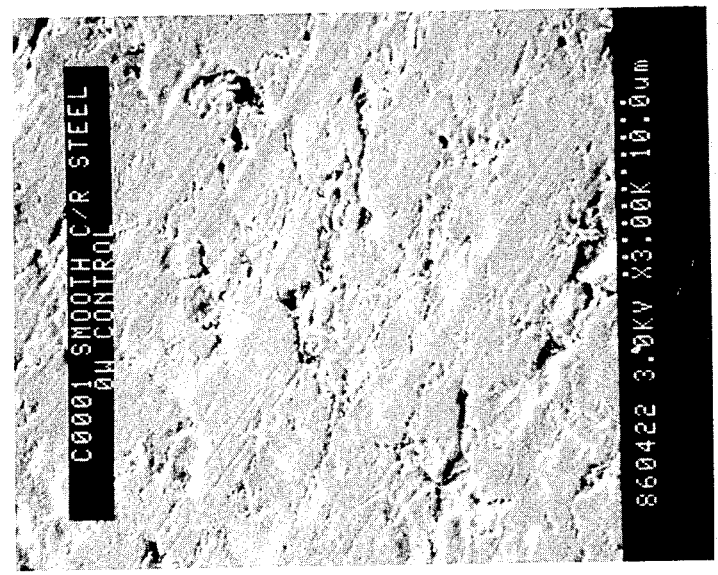

FIGS. 5A-5B show electron photomicrographs of the steel panels: (a) before laser treatment at 400×; (b) after treatment with overlapping 2.7 joules/cm$^2$ pulses at 400×; (c) before laser treatment at 3,000× magnification; and (d) after treatment with overlapping 2.7 joules/cm$^2$ pulses at 3,000× magnification. FIGS. 5(b) and (d) show apparent surface melting and the formation of projections unlike the surface discussed in Example 12 and it is believed that the projections shown in FIGS. 5(b) and (d) are at least partly responsible for the improved performance shown in Table XVIII with laser treatment.

EXAMPLE 20

The system of Example 8 is used to laser treat panels of solvent cleaned copper to form projections on the copper substrate, the projections formed by evaporation and/or melting of the copper substrate, substantially all of the projections being less than 20 micrometers in height. In this example the panels are ⅛ inch thick instead of the more usual 1/16 inch thickness. The treated 1×4 inch panels are then coated with American Cyanamid epoxy primer No. BR-127 and bonded to an identically treated panel with 3M epoxy adhesive No. AF-163-2 as in Example 6 and then wedge tested, see Table XIX.

TABLE XIX

WEDGE TESTING OF LASER TREATED COPPER PANELS BONDED TOGETHER WITH AN EPOXY ADHESIVE

| Laser Energy Density, Joules/cm$^2$ per pulse | Initial Crack Length, mm | Crack Extension, mm |
| --- | --- | --- |
| 0.0 | 43 | 20 |
| 1.4 | 47 | 3 |
| 2.7 | 30 | 8 |
| 5.5 | 47 | 12 |

The data in Table XIX show that optimum bond strength as indicated by initial crack length requires a specific power range while bond durability as indicated by crack extension is improved at all laser power levels tested. In the wedge test, low yield strength materials such as copper require thicker panels (than the usual 1/16 inch thick panels) to prevent the panels from simply curling back as the wedge is inserted between the bonded panels.

Figure 6:
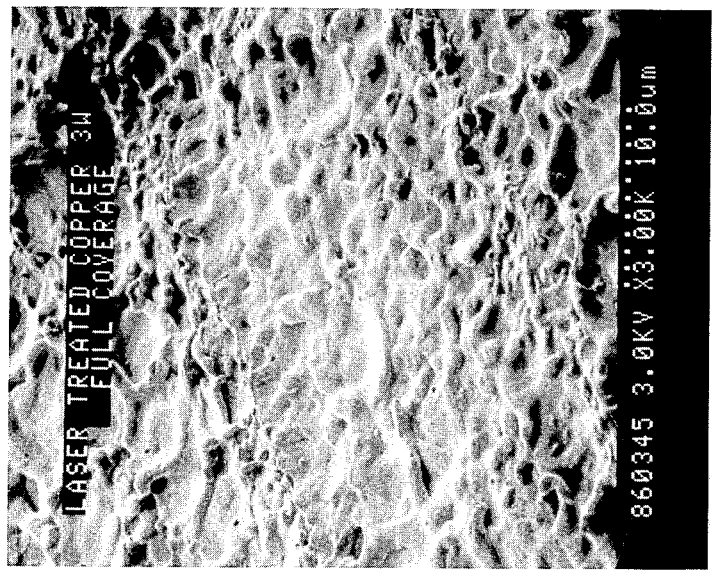
FIGS. 6A-6B show photomicrographs of laser treated copper of Example 20.
Figure 6:

FIGS. 6A-6B show 3,000× magnification electron photomicrographs of the copper panels: (a) after laser treatment with a single 1.4 joules/cm$^2$ pulse; and (b) after laser treatment with overlapping 1.4 joules/cm$^2$ pulses to form projections on the copper substrate, the projections formed by evaporation and/or melting of the copper substrate, substantially all of the projections being less than 20 micrometers in height.

EXAMPLE 21

The system of Example 8 is used to laser treat panels of solvent cleaned pure molybdenum to form projections on the molybdenum substrate, the projections formed by evaporation and/or melting of the molybdenum substrate, substantially all of the projections being less than 20 micrometers in height. The treated panels are then coated with American Cyanamid epoxy primer No. BR-127 and bonded together with 3M epoxy adhesive No. AF-163-2 as in Example 6 and then wedge tested, see Table XX.

TABLE XX

WEDGE TESTING OF LASER TREATED MOLYBDENUM PANELS BONDED TOGETHER WITH AN EPOXY ADHESIVE

| Laser Energy Density, Joules/cm² per pulse | Initial Crack Length, mm | Crack Extension, mm |
|---|---|---|
| 0.0 | 48 | 1 |
| 1.4 | 23 | 1 |
| 2.7 | 35 | 1 |

1 Panels fell apart in the humidity cabinet.

The data in Table XX indicate an optimum in bond strength enhancement at an energy density of 1.4 joules/cm² per pulse under the conditions studied as indicated by the initial crack length of the wedge test.

Figure 7:
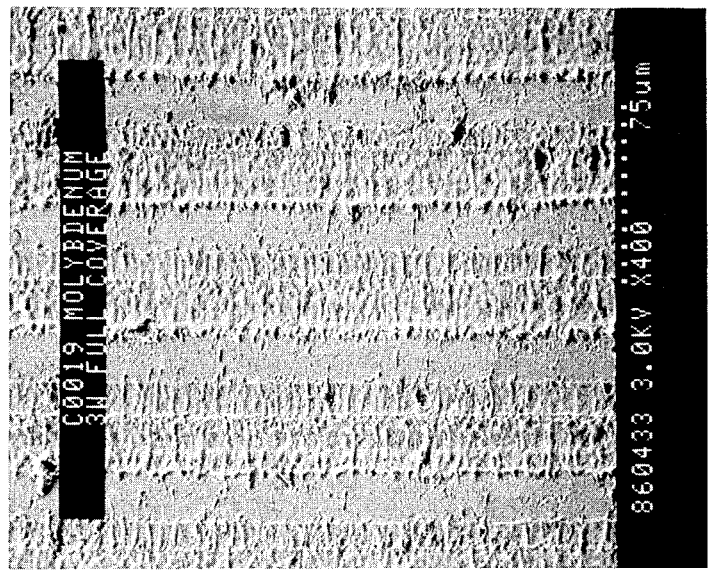
FIGS. 7A-7B show photomicrographs of laser treated molybdenum of Example 21.
Figure 7:

FIGS. 7A-7B show 400× magnification electron photomicrographs of the molybdenum panels: (a) before laser treatment; and (b) after laser treatment with 1.4 joules/cm² pulses. FIG. 9(b) shows projections on the molybdenum substrate, the projections formed by evaporation and/or melting of the molybdenum substrate, substantially all of the projections being less than 20 micrometers in height.

EXAMPLE 22

The system of Example 8 is used to laser treat panels of solvent cleaned pure tungsten to form projections on the tungsten substrate, the projections formed by evaporation and/or melting of the tungsten substrate, substantially all of the projections being less than 20 micrometers in height. The treated panels are then coated with American Cyanamid epoxy primer No. BR-127 and bonded together with 3M epoxy adhesive No. AF-163-2 as in Example 6 and then wedge tested, see Table XXI.

TABLE XXI

WEDGE TESTING OF LASER TREATED TUNGSTEN PANELS BONDED TOGETHER WITH AN EPOXY ADHESIVE

| Laser Energy Density, Joules/cm² per pulse | Initial Crack Length, mm | Crack Extension, mm |
|---|---|---|
| 0.0 | 62 | 1 |
| 2.7 | 47 | 1 |

1 Panels fell apart in the humidity cabinet.

The data in Table XXI indicate almost exactly a 25 percent reduction in initial crack length after laser treatment.

Figure 8:
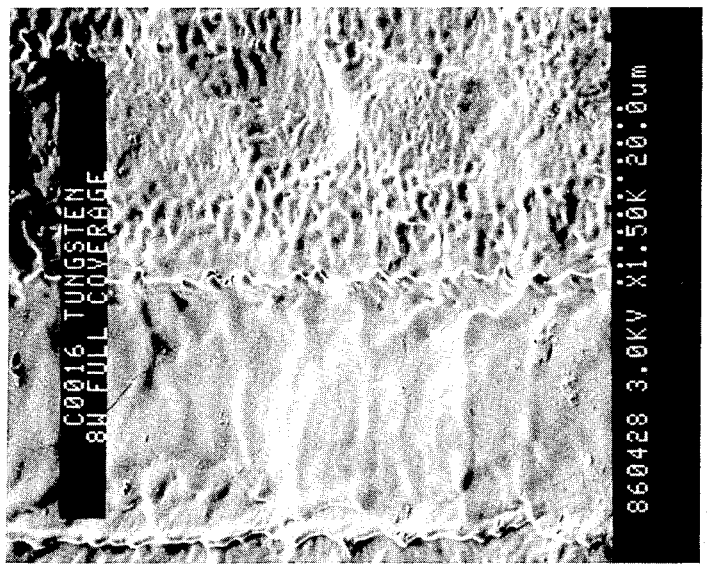
FIGS. 8A-8B show photomicrographs of laser treated tungsten of Example 23.
Figure 8:
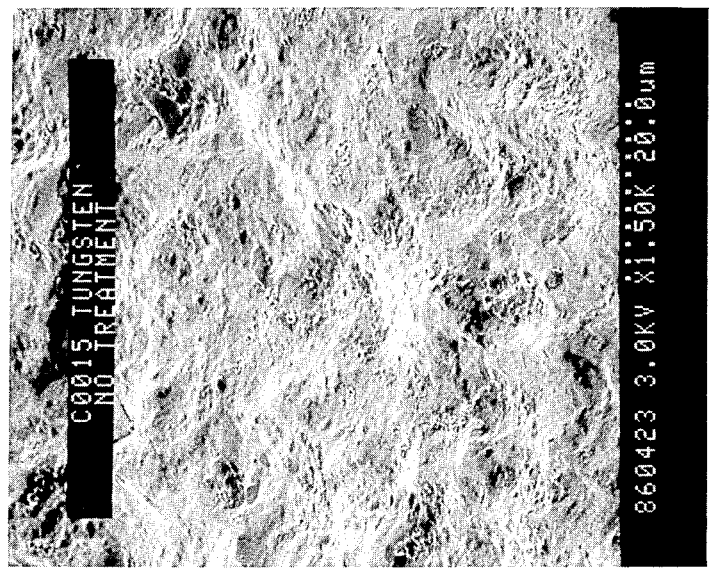

FIGS. 8A-8B show 1,500× magnification electron photomicrographs of the tungsten panels: (a) before laser treatment; and (b) after a single 2.7 joules/cm² pulse. FIG. 10(b) shows projections on the tungsten substrate, the projections formed by evaporation and/or melting of the tungsten substrate, substantially all of the projections being less than 20 micrometers in height.

EXAMPLE 23

The system of Example 8 is used to treat 0.006 inch thick solvent cleaned aluminum foil panels to form projections on the aluminum substrate, the projections formed by evaporation and/or melting of the aluminum substrate, substantially all of the projections being less than 20 micrometers in height. The treated panels are bonded together with Dow Corning Silastic 732 RTV adhesive cured at room temperature for 3 days at 70 percent relative humidity or with 3 M Scotch Weld 2216 B/A epoxy adhesive cured for 1 hour at room temperature and 1 hour at 180° F. both containing 0.5 percent, 0.004 inch diameter glass spheres, and then peel tested, see Table XXII.

TABLE XXII

PEEL TESTING OF LASER TREATED ALUMINUM FOIL BONDED TOGETHER WITH A SILICONE ADHESIVE OR AN EPOXY ADHESIVE

| Laser Energy Density, Joules/cm² per pulse | Peel Strength Pounds per Linear Inch, Silicone Adhesive | Peel Strength Pounds per Linear Inch, Epoxy Adhesive |
|---|---|---|
| 0.0 | 0.2 | 8.0 |
| 1.4 | 7.2 | 13.8 |

The data in Table XXII show that laser treatment significantly improves bond strength as indicated by the peel test for both adhesives tested.

EXAMPLE 24

The system of Example 8 is used to treat 0.055 inch thick panels of solvent cleaned Ti₆Al₄ titanium alloy with overlapping 1.4 joules/cm² pulses to form projections on the titanium substrate, the projections formed by evaporation and/or melting of the titanium substrate, substantially all of the projections being less than 20 micrometers in height. The panels are bonded together with Langley Research Center Thermoplastic Polyimide primer and adhesive resin and tested for lap shear strength. The primer coated panels are cured for 1 hour at 325° F. prior to applying the adhesive to the panels which is heated for 1.5 hours at 625° F. under vacuum at 200 psi to bond the panels together. For comparison, additional panels are chromic acid anodized according to aircraft industry standards and bonded together and tested as above. Of all the prior art treatments for titanium alloy, the chromic acid anodizing process is often preferred despite waste disposal considerations for the spent chromic acid bath liquors. The comparative data is shown in Table XXIII.

TABLE XXIII

LAP SHEAR TESTING OF LASER TREATED TITANIUM PANELS AND CHROMIC ACID ANODIZED TITANIUM PANELS BONDED TOGETHER WITH A THERMOPLASTIC POLYIMIDE ADHESIVE

| Treatment | Lap Shear Strength, psi |
|---|---|
| Laser | 4,640 |
| Anodized | 4,430 |

The data in Table XXIII show that the laser treatment provides a stronger bond than the anodizing treatment but not a significantly stronger bond. Importantly, the data show that the present invention approximately equals the best of the prior treatments for titanium alloy with regard to lap shear testing without a problem of waste disposal of spent bath liquors. If the panels of Table XXIII are heated to 400 degrees C. for 24 hours, the bond strength of the anodized treated panels is reduced by about one half while the laser treated panels bond strength is not significantly affected.

EXAMPLE 25

The system of Example 8 is used to laser treat panels of 2024-T3 aluminum at a laser energy density of 1.4 joules/cm² per pulse to form projections on the aluminum substrate, the projections formed by evaporation and/or melting of the aluminum substrate, substantially all of the projections being less than 20 micrometers in height. The panels are bonded together (½ × 1 inch overlap of the ends of the panels as in a lap shear test) with Hardman "blue/beige" two-part urethane adhesive, containing 0.5 percent, 0.004 inch (0.1 mm) diameter glass beads cured. The bonded panels are then impact tested by General Motors side impact test (modified from the ASTM D-256-81 impact test) wherein the pendulum impact head strikes at right angles to the bond. The bonded panels show an average impact strength of more then 5 foot pounds. Nonlaser treated panels bonded as above show an average impact strength of 0.4 foot pounds.

EXAMPLE 26

The system of Example 8 is used to laser treat $\frac{1}{8} \times 4 \times 0.022$ inch panels of gold clad Kovar alloy at a laser energy density of 1.4 joules/cm$^2$ per pulse to form projections on the gold/Kovar substrate, the projections formed by evaporation and/or melting of the gold/Kovar substrate, substantially all of the projections being less than 20 micrometers in height. The gold thickness is 0.0025 inches (24 carat gold). The panels are bonded together with Dow Corning Silastic ® 732 RTV silicone adhesive containing 0.5 percent, 0.020 inch diameter glass spheres and allowed to cure for 2 days at room temperature and peel tested at a crosshead speed of 2 inches per minute. The peel strength is 5.5 pounds per linear inch. Without laser treatment but bonding as above, the peel strength is 2.0 pounds per linear inch.

EXAMPLE 27

In this comparative example, Gentec Model DD-250 TEA CO$_2$ laser is focused with a spherical ZnSe lens of focal length 100 mm to achieve the energy density indicated in Table XXIV. The pulse length of this laser has a peak including approximately 50 percent of the energy of 0.1 microsecond in length. The remainder of the energy is included in a tail approximately 1.0 microsecond in length. The results in Table XXIV indicate no improvement in initial crack, durability, or mode of failure with laser treatment of approximately 5 joules/cm$^2$ per pulse.

TABLE XXIV

| Material | Laser Energy Density, Joules/cm$^2$ per pulse | Initial Crack Length, mm | Crack Extension, mm |
|---|---|---|---|
| Aluminum | 0 | 36.1 | 34.5 |
|  | 5.2 | 34.8 | 42 |
| Cold Rolled Steel | 0 | 40 | 8.5 |
|  | 5.2 | 40 | 7.6 |

EXAMPLE 28

The system of Example 1 is used with the Q-switch of the laser turned off for this comparative example. 1×4×0.125 inch solvent cleaned panels of 2024 T-3 aluminum were laser treated (approximately 190 joules/cm$^2$ per pulse) according to the teachings of Japanese Patent Application No. 59-85392 to produce projections on the aluminum surface, substantially all of the projections ranging from 20 to 45 micrometers in height. The panels were then coated with American Cyanamid epoxy primer No. Br-127, cured at 250 degrees F. for 1 hour and bonded to an identically treated panel with 3M epoxy adhesive No. AF-163-2, OST, Grade 5, cured at 250 degrees F. for 1.5 hours under vacuum at 100 psi and then wedge tested. The wedge testing showed a crack extension of 8 millimeters plus or minus 1.7 millimeters after 70 hours of exposure in the humidity cabinet. For comparison, duplicate panels treated according to the present invention, identically bonded and wedge tested showed a crack extension of 5 millimeters plus or minus 1 millimeter after 70 hours exposure in the humidity cabinet. This example demonstrates the advance in the art of this invention relative to the invention of Japanese Patent Application No. 59-85392 with regard to bond durability upon exposure to moisture.

Figure 9:
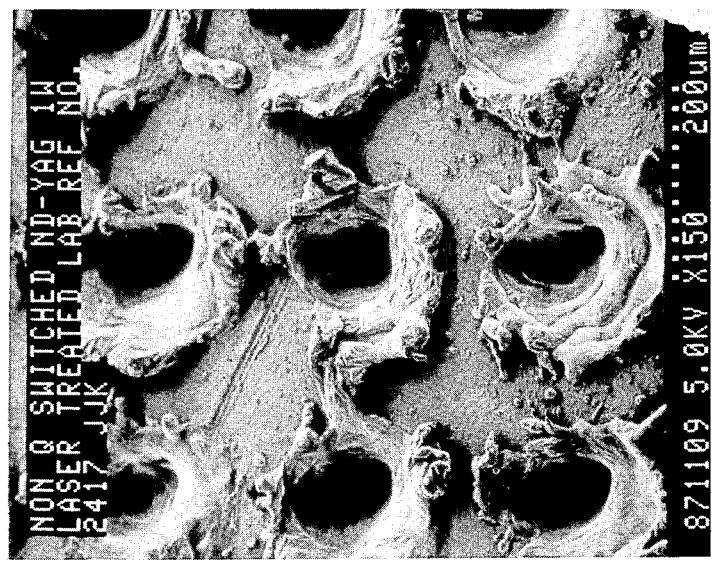
FIG. 9 shows a photomicrograph of laser treated aluminum of Example 28.

FIG. 9 shows a 150 × magnification electron photomicrograph of the above referred to aluminum panel treated according to the teachings of Japanese Patent Application No. 59-85392. Substantially all of the projections shown in FIG. 9 range from 20 to 45 micrometers in height as determined by microscopy.

The following will reveal the gist of the present invention that others can, by applying current knowledge, be readily adapted for various applications without admitting features that, from the standpoint of prior art, fairly constitute essential characteristics of the generic and specific aspects of this contribution to the art and, therefore, such adaptations should and are intended to be comprehended within the meaning and range or equivalence of the appended claims.

What is claimed is:

1. A method for molding an object to a body having a metallic substrate, the method comprising the steps of pretreating an area of the metallic substrate of the body, contacting the body with a mold, the mold having a chamber at least partially defining the shape of the object to be molded to the body, at least a portion of the pretreated area of the metallic substrate of the body exposed to the chamber, filling the mold with a molding compound so that the molding compound contacts the walls of the mold and at least a portion of the pretreated area of the metallic substrate of the body, curing the molding compound in the chamber so that an object is molded to the body, the improvement which comprises as the step of pretreating an area of the metallic substrate of the body, the step of:

placing the body in the path of an energy beam having a selected energy density of from 0.001 to 1,000 joules/cm$^2$ for a duration of from 0.1 to 100 nanoseconds effective to form projections on the metallic substrate of the body, the projections formed by melting of the metallic substrate of the body, substantially all of the projections being less than 20 micrometers in height.

2. The method of claim 1 wherein said energy beam is generated by a laser.

3. The method of claim 2 wherein the first body comprises an aluminum substrate.

4. The method of claim 2 wherein the first body comprises a titanium substrate.

5. The method of claim 2 wherein the first body comprises a copper substrate.

6. The method of claim 2 wherein the first body comprises a steel substrate.

7. The method of claim 2 wherein the first body comprises a magnesium substrate.

8. A method for molding an object to a body having a metallic substrate and a filler therein, the method comprising the steps of pretreating an area of the metallic substrate of the body, contacting the body with a mold, the mold having a chamber at least partially defining the shape of the object to be molded to the body, at least a portion of the pretreated area of the metallic substrate of the body exposed to the chamber, filling the mold with molding compound so that the uncured molding compound contacts the walls of the mold and at least a portion of the pretreated area of the metallic substrate of the body, curing the molding compound in the chamber so that an object is molded to the body, the improvement which comprises as the step of pretreating an area of the metallic substrate of the body, the step of:

placing the body in the path of an energy beam having a selected energy density of from 0.001 to 1,000 joules/cm$^2$ for a duration of from 0.1 to 100 nanoseconds effective to expose a portion of the filler of the body by evaporation of the metallic substrate of the body.

9. The method of claim 8 wherein said energy beam is generated by a laser.

10. The method of claim 9 wherein the first body comprises an aluminum substrate.

11. The method of claim 9 wherein the first body comprises a titanium substrate.

12. The method of claim 9 wherein the first body comprises a copper substrate.

13. The method of claim 9 wherein the first body comprises a steel substrate.

14. The method of claim 9 wherein the first body comprises a magnesium substrate.

* * * * *